United States Patent
Haas et al.

(10) Patent No.: US 9,063,872 B2
(45) Date of Patent: *Jun. 23, 2015

(54) FORWARD ERROR CORRECTION WITH CONFIGURABLE LATENCY

(71) Applicant: Altera Canada Co., Toronto (CA)

(72) Inventors: Wally Haas, Mount Pearl (CA); Chuck Rumbolt, St. John's (CA)

(73) Assignee: Altera Canada Co., Toronto, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/139,402

(22) Filed: Dec. 23, 2013

(65) Prior Publication Data
US 2014/0189446 A1 Jul. 3, 2014

Related U.S. Application Data

(63) Continuation of application No. 13/793,826, filed on Mar. 11, 2013, now Pat. No. 8,645,771, which is a continuation of application No. 12/954,784, filed on Nov. 26, 2010, now Pat. No. 8,413,026.

(51) Int. Cl.
*H03M 13/03* (2006.01)
*G06F 11/10* (2006.01)
*H03M 13/15* (2006.01)
*H03M 13/37* (2006.01)
*G06F 11/07* (2006.01)
*H03M 13/00* (2006.01)

(52) U.S. Cl.
CPC ............. *G06F 11/10* (2013.01); *H03M 13/152* (2013.01); *H03M 13/3738* (2013.01); *H03M 13/618* (2013.01); *H03M 13/6505* (2013.01); *G06F 11/102* (2013.01); *G06F 11/0751* (2013.01)

(58) Field of Classification Search
CPC .. H03M 13/152; H03M 13/15; G06F 11/0751
USPC .......................... 714/704, 746, 752, 774, 819
See application file for complete search history.

(56) References Cited

U.S. PATENT DOCUMENTS 6,252,917 B1   6/2001  Freeman
7,434,139 B2   10/2008  Barton et al.
7,925,936 B1 *  4/2011  Sommer ....................... 714/704

OTHER PUBLICATIONS

Benaissa et al., "Reconfigurable Hardware Architectures for Sequential and Hybrid Decoding," IEEE Transactions on Circuits and Systems—I: Regular Papers, vol. 54, No. 3, Mar. 2007, pp. 555-565.

* cited by examiner

*Primary Examiner* — Shelly A Chase
(74) *Attorney, Agent, or Firm* — Ropes & Gray LLP

(57) ABSTRACT

A method of performing forward error correction with configurable latency, where a configurable latency algorithm evaluates a target Bit Error Rate (BER) against an actual BER and adjusts the size of a configurable buffer such that the target BER may be achieved when utilizing the smallest buffer size possible. When errors are corrected without the utilization of each of the configurable buffer locations, the algorithm reduces the size of the buffer by y buffer locations; the algorithm may continue to successively reduce the size of said buffer until the minimum number of buffer locations are utilized to achieve the target BER. If the buffer locations have been reduced such that the buffer size is too small and the target BER cannot be achieved, the algorithm may increase the size of the buffer until the minimum number of buffer locations are utilized to achieve the target BER.

20 Claims, 1 Drawing Sheet

FORWARD ERROR CORRECTION WITH CONFIGURABLE LATENCY

CROSS-REFERENCE TO RELATED APPLICATIONS

This application is a continuation of U.S. application Ser. No. 13/793,826, filed Mar. 11, 2013 (now U.S. Pat. No. 8,645,771), which is a continuation of U.S. patent application No. 12/954,784, filed Nov. 26, 2010 (now U.S. Pat. No. 8,413,026), each of which is hereby incorporated by reference in its entirety.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Technical Field of the Invention

The present invention discloses a method of performing forward error correction with a configurable latency for digital communications systems.

2. Background of the Invention

Long-distance digital communication systems, such as optical submarine cable systems, are responsible for the transmission of significant amounts of data. This data is transmitted across great distances, often from continent to continent. During transmission, data can become corrupted from noise within transmission channels, faults in transmission or receiving devices, or data errors from reading from and writing to an elastic store. Therefore, Forward Error Correction (FEC) is employed to minimize the error probability of transmitted data.

Claude Shannon first suggested a maximum possible channel throughout which developed into a theorem of error correction describing the addition of redundant data to payload data for the correction of errors from channel noise or interference during transmission. This FEC increases the reliability of transmitted data by encoding a block of payload data with redundant data bits through an algorithm generated at the transmitter, which allows a decoder to determine if an error has occurred. The decoder employs the code generated by the encoder to identify what information, if any, has been corrupted by noise or interference during transmission, and the decoder can in turn correct these errors.

Typically, a FEC system architecture provides a fixed latency system, meaning that the architecture could be limited to the type of data application it can be utilized with. To allow the system to adapt for use with various data applications, a method of providing a configurable latency FEC is required.

SUMMARY OF THE INVENTION

The present invention discloses a method of performing forward error correction with configurable latency, where a configurable latency algorithm evaluates a target Bit Error Rate (BER) against an actual BER and adjusts the size of a configurable buffer such that the target BER may be achieved when utilizing the smallest buffer size possible.

The configurable latency algorithm begins by utilizing the maximum number of available buffer locations within the configurable buffer to achieve the target BER. When errors are corrected without the utilization of each of the configurable buffer locations, the algorithm reduces the size of the buffer by y buffer locations; the algorithm may continue to successively reduce the size of said buffer until the minimum number of buffer locations are utilized to achieve the target BER. If the buffer locations have been reduced such that the buffer size is too small and the target BER cannot be achieved, the algorithm may increase the size of the buffer until the minimum number of buffer locations are utilized to achieve the target BER.

DETAILED DESCRIPTION OF THE INVENTION

Figure 1:
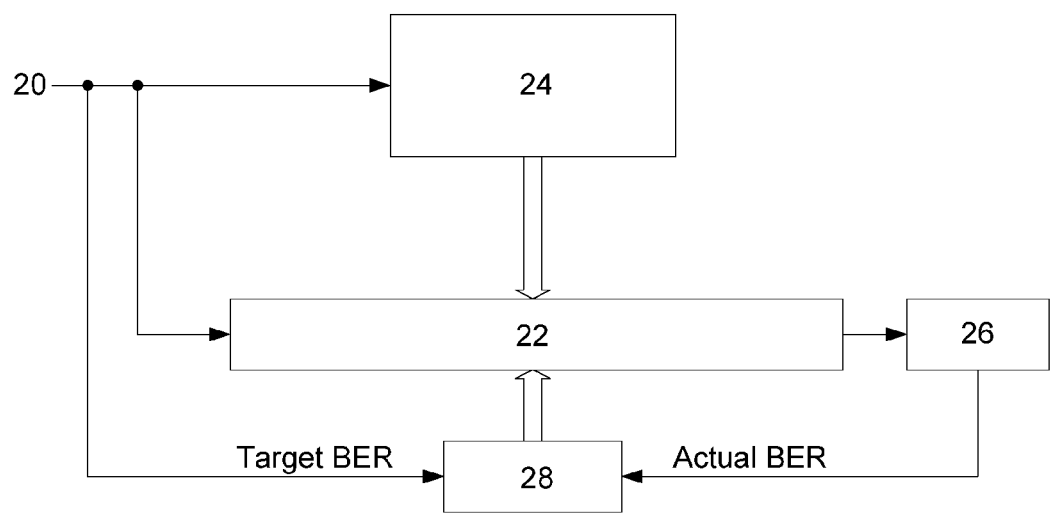
FIG. 1 illustrates a block diagram of the architecture of the present invention.
Figure 2:
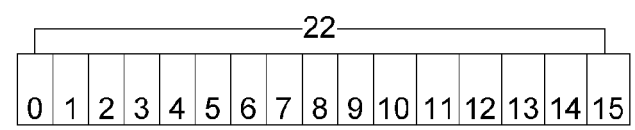
FIG. 2 illustrates a block diagram of an illustrative embodiment of the invention.

FIG. 1 depicts an illustrative embodiment of the present invention, whereby configurable buffer (22) is set to utilize the maximum number of buffer locations. For exemplary purposes, FIG. 2 illustrates configurable buffer (22) with 16 buffer locations, labeled 0-15. It should be noted that FIG. 2 is provided for exemplary purposes and is not meant to limit the scope of the invention, as any size buffer may be utilized. As illustrated in FIG. 1, input data (20) is transmitted into the system and written into configurable buffer (22), FEC block (24) and algorithmic logic block (28), where algorithmic logic block (28) represents the configurable latency algorithm. Data input (20) includes a target BER; when given this Target BER, the algorithmic logic block (28) starts by utilizing the maximum number of configurable buffer (22) locations to achieve the target BER.

As data is input to the system, FEC block (24) is able to act upon the data as it is transmitted through configurable buffer (22). As illustrated, data corrected by FEC block (24) is output from configurable buffer (22) into error monitor (26). Error monitor (26) evaluates the actual BER and inputs the actual BER into algorithmic logic block (28), allowing algorithmic logic block (28) to compare the target BER and actual BER such that the algorithmic logic block (28). The configurable latency algorithm of algorithmic logic block (28) is now able to determine the amount of buffer locations and the amount of latency required to output the correct BER and can effectively conFIG. the number of locations required in configurable buffer (22).

If the data travels through configurable buffer (22) such that the target BER is achieved without utilizing each of the configurable buffer (22) locations, the configurable latency algorithm of algorithmic logic block (28) reduces the number of configurable buffer (22) locations utilized by x and begins the process again. This process is repeated to reduce the number of locations of configurable buffer (22) to the minimum buffer size. Once errors occur, or the data travelling through configurable buffer (22) cannot achieve the target BER, the configurable latency algorithm increases the number of locations of configurable buffer (22) by y. It should be noted that x does not have to be the same value as y.

An illustrative embodiment of the present invention employs FEC in the form of a Bose Ray-Chaudhuri (BCH) (1023, 993) parent code, shortened to BCH (1000, 970). BCH codes are cyclic, error-correcting, digital codes of variable lengths which are able to correct errors in transmitted data. BCH codes typically employ a polynomial over a finite field, and a BCH codeword consists of a polynomial that is a multiple of the generator polynomial. The illustrative embodiment of the present invention operates on an m=10 Galois field with a t=3 value, where t represents the number of errors that can be corrected within a row code or a column code. It should be noted that this example is provided for illustrative purposes only and is not meant to limit the scope of the invention, as other FEC codes may be utilized.

By utilizing this configurable latency architecture, the same FEC architecture can be adapted for use across communication channels of varying BERs, while still maintaining data integrity. Such adaptability is desirable where the same architecture can be adapted for use with various data applications.

We claim:

1. A method for forward error correction using a configurable buffer, the method comprising:
    storing data associated with a target bit error rate in a number of locations of the configurable buffer; and
    reducing the number of locations of the configurable buffer for storing the data if a bit error rate based on forward error correction of the stored data achieves the target bit error rate.

2. The method of claim 1 further comprising increasing the number of locations of the configurable buffer for storing the data if the bit error rate does not achieve the target bit error rate.

3. The method of claim 1, wherein the bit error rate achieves the target bit error rate if the bit error rate is not greater than the target bit error rate.

4. The method of claim 1, wherein the number of locations of the configurable buffer corresponds to latency associated with achieving the target bit error rate.

5. The method of claim 1, wherein the number of locations of the configurable buffer is a maximum number of available locations of the configurable buffer.

6. The method of claim 1, wherein the forward error correction code is a Bose Ray-Chaudhuri (BCH) code.

7. An apparatus for forward error correction, the apparatus comprising:
    a configurable buffer, wherein a number of locations of the configurable buffer store data associated with a target bit error rate; and
    logic circuitry for reducing the number of locations of the configurable buffer for storing the data if a bit error rate based on forward error correction of the stored data achieves the target bit error rate.

8. The apparatus of claim 7, wherein the logic circuitry increases the number of locations of the configurable buffer for storing the data if the bit error rate does not achieve the target bit error rate.

9. The apparatus of claim 7, wherein the bit error rate achieves the target bit error rate if the bit error rate is not greater than the target bit error rate.

10. The apparatus of claim 7, wherein the number of locations of the configurable buffer corresponds to latency associated with achieving the target bit error rate.

11. The apparatus of claim 7, wherein the number of locations of the configurable buffer is a maximum number of available locations of the configurable buffer.

12. The apparatus of claim 7, wherein the forward error correction code is a Bose Ray-Chaudhuri (BCH) code.

13. The apparatus of claim 7, wherein the target bit error rate is received by the logic circuitry with the data.

14. A method for forward error correction with configurable latency, the method comprising:
    storing data associated with a target bit error rate in a configurable buffer of a selected size; and
    adjusting the size of the configurable buffer based on a comparison between the target bit error rate and a bit error rate based on forward error correction of the stored data.

15. The method of claim 14 further comprising reducing the size of the configurable buffer by a first amount if the bit error rate achieves the target bit error rate.

16. The method of claim 15 further comprising increasing the size of the configurable buffer by a second amount if the bit error rate does not achieve the target bit error rate.

17. The method of claim 15, wherein the bit error rate achieves the target bit error rate if the bit error rate is not greater than the target bit error rate.

18. The method of claim 16, wherein the first amount is different from the second amount.

19. The method of claim 14, wherein the selected size of the configurable buffer corresponds to the maximum size of the configurable buffer.

20. The method of claim 14, wherein the forward error correction code is a Bose Ray-Chaudhuri (BCH) code.

* * * * *